United States Patent
Lee et al.

(10) Patent No.: US 8,258,556 B2
(45) Date of Patent: Sep. 4, 2012

(54) THIN FILM TRANSISTOR, THIN FILM TRANSISTOR ARRAY PANEL, AND DISPLAY DEVICE

(75) Inventors: Seong-Young Lee, Seoul (KR); Jong-Woong Chang, Suwon (TW)

(73) Assignee: Samsung Electronics Co., Ltd. (KR)

( * ) Notice: Subject to any disclaimer, the term of this patent is extended or adjusted under 35 U.S.C. 154(b) by 19 days.

(21) Appl. No.: 10/575,819

(22) PCT Filed: Oct. 13, 2004

(86) PCT No.: PCT/KR2004/002611
§ 371 (c)(1),
(2), (4) Date: Apr. 13, 2006

(87) PCT Pub. No.: WO2005/036653
PCT Pub. Date: Apr. 21, 2005

(65) Prior Publication Data
US 2007/0051943 A1    Mar. 8, 2007

(30) Foreign Application Priority Data
Oct. 13, 2003 (KR) .................... 10-2003-0071090

(51) Int. Cl.
*H01L 31/062* (2012.01)
*H01L 29/04* (2006.01)
(52) U.S. Cl. .............. 257/291; 257/72; 257/E33.065
(58) Field of Classification Search .......... 257/40, 257/E51.005, E51.02, 202, 257, 57.59, 72, 257/291, E33.065, E33.062; 349/2
See application file for complete search history.

(56) References Cited

U.S. PATENT DOCUMENTS

| | | | | |
|---|---|---|---|---|
| 4,821,092 A | * | 4/1989 | Noguchi | 257/10 |
| 4,853,755 A | * | 8/1989 | Okabe et al. | 257/72 |
| 5,097,297 A | * | 3/1992 | Nakazawa | 257/347 |
| 5,648,674 A | | 7/1997 | Weisfield et al. | |
| 5,859,677 A | * | 1/1999 | Watanabe et al. | 349/38 |
| 6,011,274 A | | 1/2000 | Gu et al. | |
| 6,091,467 A | * | 7/2000 | Kubo et al. | 349/44 |
| 6,365,915 B1 | | 4/2002 | Hirai et al. | |

(Continued)

FOREIGN PATENT DOCUMENTS

JP    1-94670    4/1989

(Continued)

OTHER PUBLICATIONS

Patent Abstracts of Japan, 2000-147574, May 26, 2000, 1 p.

(Continued)

*Primary Examiner* — Wael Fahmy
*Assistant Examiner* — Sarah Salerno
(74) *Attorney, Agent, or Firm* — Innovation Counsel LLP

(57) ABSTRACT

A thin film transistor is provided, which includes: a gate electrode (124); a gate insulating layer (140) formed on the gate electrode; a semiconductor layer (154) formed on the gate insulating layer and disposed opposite the gate electrode; a source electrode (173) and a drain electrode (175) that are formed at least in part on the semiconductor layer and face each other, a passivation layer (180) formed on the source electrode, the drain electrode, and a portion of the semiconductor layer that is not covered with the source electrode and the drain electrode; and a shielding electrode (196) formed on the passivation layer and disposed on a region between the source electrode and the drain electrode.

32 Claims, 14 Drawing Sheets

U.S. PATENT DOCUMENTS

| | | |
|---|---|---|
| 6,573,969 B1 | 6/2003 | Watanabe et al. |
| 2001/0030323 A1* | 10/2001 | Ikeda ............................ 257/59 |
| 2001/0038432 A1* | 11/2001 | Yanagawa et al. ............ 349/141 |
| 2002/0057396 A1* | 5/2002 | Tsubo ............................. 349/43 |
| 2002/0159016 A1* | 10/2002 | Nishida et al. ................ 349/141 |
| 2003/0133066 A1* | 7/2003 | Ono et al. ..................... 349/141 |
| 2004/0066481 A1* | 4/2004 | Hong et al. .................... 349/141 |
| 2005/0110924 A1* | 5/2005 | Kim et al. ..................... 349/111 |

FOREIGN PATENT DOCUMENTS

| | | |
|---|---|---|
| JP | 1-189632 | 7/1989 |
| JP | 8-46206 | 2/1996 |
| JP | 10-98190 | 4/1998 |
| JP | 10098190 A * | 4/1998 |
| JP | 2000-147574 | 5/2000 |
| KR | 1999-0078272 | 10/1999 |
| KR | 2001-0062260 | 7/2001 |
| KR | 2002-0047017 | 6/2002 |
| KR | 0359847 | 10/2002 |
| KR | 0380142 | 4/2003 |

OTHER PUBLICATIONS

Patent Abstracts of Japan, Publication No. 08-046206, Feb. 16, 1996, 1 p.

Korean Patent Abstracts, Publication No. 1020010062260, Jul. 7, 2001, 2 pp.

Korean Patent Abstracts, Publication No. 1020020047017, Jun. 21, 2002, 1 p.

Korean Patent Abstracts, Publication No. 10-0359847, Oct. 23, 2002, 2 pp.

Korean Patent Abstracts, Publication No. 10-0380142, Apr. 1, 2003, 2 pp.

* cited by examiner

THIN FILM TRANSISTOR, THIN FILM TRANSISTOR ARRAY PANEL, AND DISPLAY DEVICE

TECHNICAL FIELD

The present invention relates to a thin filmtransistor, a thin film transistor array panel, and a display device.

BACKGROUND ART

A flat panel display such as a liquid crystal display (LCD) and an organic light emitting display (OLED) includes a display panel, drivers for driving the display panel, and a controller for controlling the drivers.

A display panel for an LCD or an OLED generally includes a plurality of pixel electrodes arranged in a matrix and a common electrode covering an entire surface of the display panel and supplied with a common voltage. Between the pixel electrodes and the common electrode, an LCD further includes a liquid crystal (LC) layer having dielectric anisotropy, while an OLED includes a plurality of organic light emitting members.

The display panel further includes a plurality of switching elements such as thin film transistors (TFTs), and a plurality of gate lines and data lines. The gate lines transmit gate signals, each having a gate-on voltage for turning on the switching elements and a gate-off voltage for turning off the switching elements, and the data lines transmit data signals.

The drivers of the display device include a gate driver generating the gate signals and applying the gate signals to the gate lines and a data driver generating the data signals and applying the data signals to the data lines. The gate driver and the data driver may include a plurality of driving integrated circuit (IC) chips mounted on the display panel or on flexible printed circuit (FPC) films, which in turn are attached to the display panel.

In addition, the drivers, particularly the gate driver is often integrated on the display panel along with the switching elements for increasing an effective display area, decreasing the size of the flame, and reducing the manufacturing cost. At this time, the gate driver includes a plurality of TFTs.

Hereinafter, the TFTs connected to the pixel electrodes are referred to as pixel TFTs, while the TFTs of the gate driver are referred to as driver TFTs. Each of the TFTs has a gate electrode, a source electrode, and a drain electrode.

DISCLOSURE OF INVENTION

Technical Problem

In the meantime, the TFTs disposed under the common electrode are affected by the common voltages applied to the common electrode.

The threshold voltage (Vt) of a TFT is represented as:

$$Vt = Vt_0 + \gamma(\sqrt{2\phi_f + Vcs} - \sqrt{2\phi_f}) \qquad (1)$$

Here, Vcs=Vcom—Vs (where Vcom is a common voltage and Vs is a voltage of the source electrode of the TFT), Vt0 indicates the threshold voltage when Vcs=0, v is a manufacturing process parameter, and $\phi f$ is a physical parameter constant.

As shown in Equation (1), the threshold voltage (Vt) depends on Vcs and thus on the common voltage (Vcom).

In particular, when the common voltage (Vcom) becomes high to increase the threshold voltage (Vt), a driving voltage applied to the gate electrode of the TFT for turning on the TFT is increased and thus the currents in a turn-on state of the TFT are decreased, thereby decreasing the operational efficiency of the TFT.

In addition, a parasitic capacitor generated between the common electrode and the gate electrode decreases an output voltage of the TFT. For example, when the TFT is a driver TFT disposed at an output terminal of the gate driver, the output voltage corresponds to a gate-on voltage for turning on pixel TFTs and the decreased magnitude of the gate-on voltage may not turn on the pixel TFTs.

Furthermore, the driver TFT is much larger than the pixel TFT such that the driver TFT has a channel width equal to 7,000-10,000 microns. Therefore, the parasitic capacitance between the common electrode and the gate electrode becomes very large. For an example of a low-voltage driving LC, the parasitic capacitance (Cgs) between the gate electrode and the source electrode and the parasitic capacitance (Cgc) between the gate electrode and the common electrode have a relation, $$Cgs:Cgc = 4.6:1. \qquad (2)$$

Relation (2) shows that the parasitic capacitance (Cgc) between the gate electrode and the common electrode is very large to have an effect on the operation of the TFT.

The present invention is provided for solve the problems of the conventional art.

Technical Solution

A thin film transistor is provided, which includes: a gate electrode; a gate insulating layer formed on the gate electrode; a semiconductor layer formed on the gate insulating layer and disposed opposite the gate electrode; a source electrode and a drain electrode that are formed at least in part on the semiconductor layer and face each other; a passivation layer formed on the source electrode, the drain electrode, and a portion of the semiconductor layer that is not covered with the source electrode and the drain electrode; and a shielding electrode formed on the passivation layer and disposed on a region between the source electrode and the drain electrode.

The shielding electrode may be electrically isolated.

Alternatively, the shielding electrode may be supplied with a predetermined voltage and the predetermined voltage supplied to the shielding electrode may be equal to or lower than a ground voltage or may be a negative voltage.

The shielding electrode may include IZO or ITO and may have a shape of horseshoes.

The passivation layer may include organic insulator.

A thin film transistor array panel is provided, which includes: a gate line and a data lie; a first thin film transistor including a control electrode, an input electrode, an output electrode, and a channel portion disposed between the input electrode and the output electrode and generating a gate signal to be applied to the gate line; a second thin film transistor including a gate electrode connected to the gate line, a source electrode connected to the data line, a drain electrode, and a channel portion disposed between the source electrode and the drain electrode and transmitting a data signal from the data line in response to the gate signal from the gate line; a pixel electrode connected to the drain electrode to receive the data signal; and a first shielding electrode disposed on the channel portion of the first thin film transistor.

The first shielding electrode may be electrically isolated.

The first shielding electrode may be supplied with a predetermined voltage. The predetermined voltage supplied to the first shielding electrode may be equal to or lower than a ground voltage, may be a negative voltage, or may have a magnitude for turning off the second thin film transistor.

The first shielding electrode may include the same layer as the pixel electrode.

The thin film transistor array panel may further include a second shielding electrode disposed on the channel portions of the second thin film transistor and including the same layer as the pixel electrode.

The thin film transistor array panel may further include an insulating layer disposed between the first and the second thin film transistors and the first and the second shielding electrodes.

The insulating layer may include organic material.

A display device is provided, which includes: a gate line and a data line; a first thin film transistor including a channel portion and generating a gate signal to be applied to the gate line; a second thin film transistor transmitting a data signal from the data line in response to the gate signal from the gate line; a pixel electrode connected to the second thin film transistor to receive the data signal; a shielding electrode disposed on the channel portion of the first thin film transistor; and a common electrode facing the pixel electrode.

The shielding electrode may face the common electrode.

The shielding electrode may be supplied with a predetermined voltage lower than a voltage applied to the common electrode and the predetermined voltage supplied to the shielding electrode may have a magnitude for turning off the second thin film transistor.

The shielding electrode may include the same layer as the pixel electrode.

The display device may further include a dielectric layer disposed between the shielding electrode and the Common electrode and the dielectric layer may include a liquid crystal layer.

Advantageous Effects

The shielding electrodes block the effect of a common voltage applied to the Common electrode on the channels of the TFTs to prevent the deterioration of the threshold voltage of the TFTs. In addition, the application of the predetermined voltage such as a gate-off voltage lower than a common voltage to the shielding electrodes reduces a driving voltage of the TFTs and advances the switching time of the TFTs, thereby increasing the efficiency of input voltages supplied to the TFTs and the efficiency of the operation of the TFTs.

Furthermore, the employment of the shielding electrode does not increase the manufacturing cost or do not complicate the manufacturing process since the shielding electrodes are formed along with the pixel electrodes.

BRIEF DESCRIPTION OF THE DRAWINGS

The present invention will become more apparent by describing embodiments thereof in detail with reference to the accompanying drawing in which.

BEST MODE FOR CARRYING OUT THE INVENTION

Figure 1:
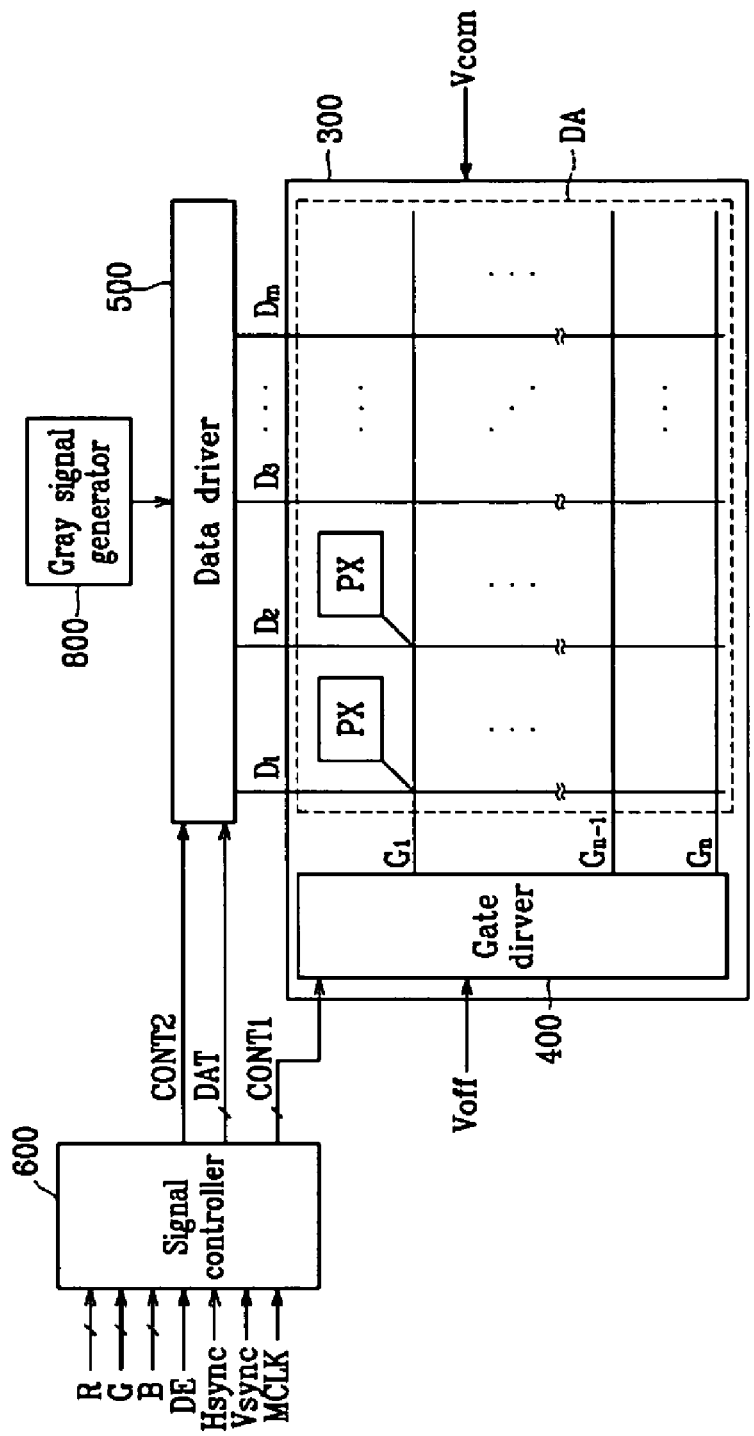
FIG. 1 is a block diagram of a display device according to an embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein. Like numerals refer to like elements throughout.

In the drawings, the thickness of layers and regions are exaggerated for clarity. Like numerals refer to like elements throughout. It will be understood that when an element such as a layer, region or substrate is referred to as being on another element, it can be directly on the other element or intervening elements may also be present In contrast, when an element is referred to as being directly on another element, there are no intervening elements present Then, TFTs, TFT array panels, and display devices according to embodiments of the present invention will be described with reference to the accompanying drawings.

Figure 2:
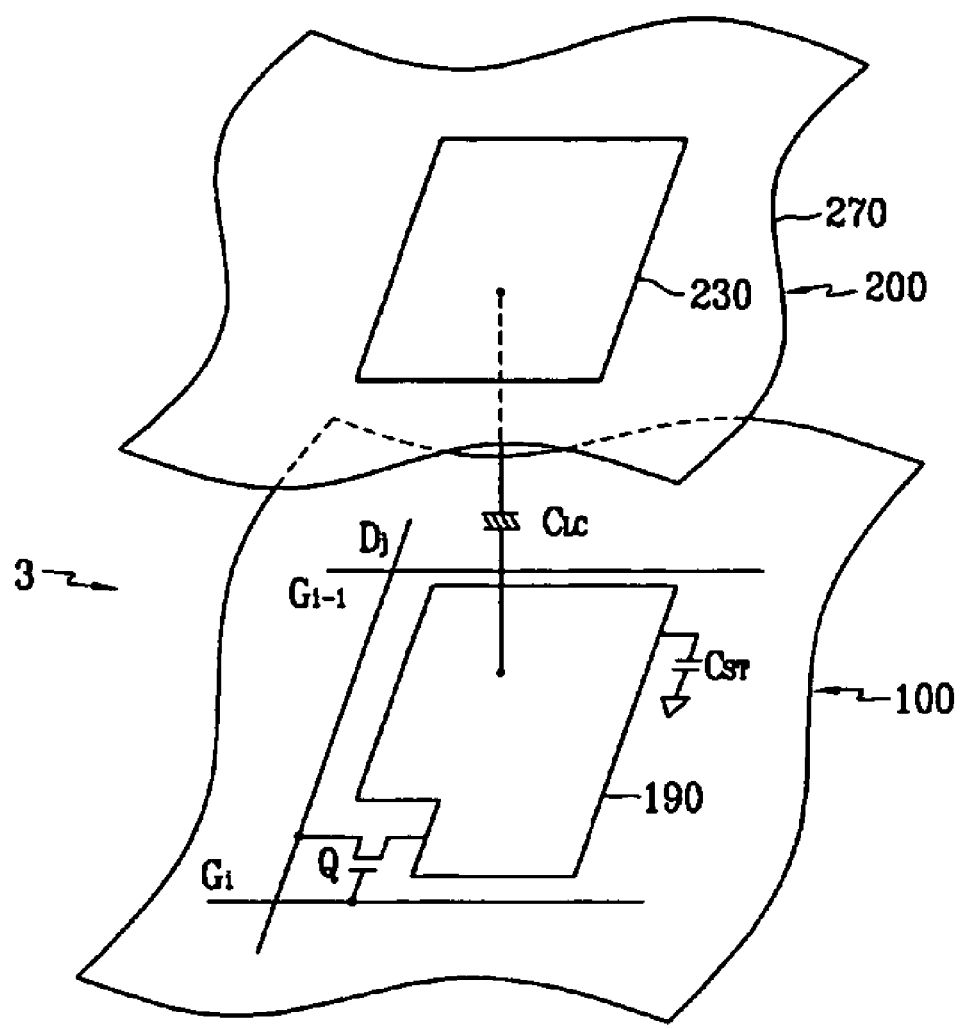
FIG. 2 is an equivalent circuit diagram of a pixel of an LCD illustrated as an example of a display device according to an embodiment of the present invention.

FIG. 1 is a block diagram of a display device according to an embodiment of the present invention, and FIG. 2 is an equivalent circuit diagram of a pixel of an LCD illustrated as an example of a display device according to an embodiment of the present invention.

Referring to FIG. 1, a display device according to an embodiment includes a display panel unit 300, a gate driver 400 and a data driver 500 that are connected to the panel unit 300, a gray signal generator 800 connected to the data driver 500, and a signal controller 600 controlling the above elements.

Referring to FIG. 1, the panel unit 300 includes a plurality of display signal lines $G_l$-$G_n$ and $D_l$-$D_m$ and a plurality of pixels PX connected thereto and arranged substantially in a matrix to form a display area DA. Referring to FIG. 2, a panel unit 300 for an LCD includes lower and upper panels 100 and 200 and a LC layer 3 interposed therebetween. A panel unit 300 for an organic light emitting display (OLED) may include a single panel.

The display signal lines $G_l$-$G_n$ and $D_l$-$D_m$ include a plurality of gate lines $G_l$-$G_n$ transmitting gate signals (also referred to as scanning signals), and a plurality of data lines $D_l$-$D_m$ transmitting data signals. The gate lines $G_l$-$G_n$ extend substantially in a row direction and substantially parallel to each other, while the data lines $D_l$-$D_m$ extend substantially in a column direction and substantially parallel to each other.

Each pixel PX includes at least a switching element (not shown) such as a TFT and at least a capacitor (not shown).

Referring to FIG. 2, each pixel PX of the LCD includes a switching element Q connected to the signal lines $G_1$-$G_n$ and $D_1$-$D_m$, and a LC capacitor $C_{LC}$ and a storage capacitor $C_{ST}$ that are connected to the switching element Q. The display signal lines $G_1$-$G_n$ and $D_1$-$D_m$ are disposed on the lower panel 100 and the storage capacitor $C_{ST}$ may be omitted if unnecessary.

The switching element Q including a TFT is provided on the lower panel 100 and has three terminals: a control terminal connected to one of the gate lines $G_1$-$G_n$; an input terminal connected to one of the data lines $D_1$-$D_m$; and an output terminal connected to both the LC capacitor $C_{LC}$ and the storage capacitor $C_{ST}$.

The LC capacitor $C_{LC}$ includes a pixel electrode 190 provided on the lower panel 100 and a common electrode 270 provided on the upper panel 200 as two terminals. The LC layer 3 disposed between the two electrodes 190 and 270 functions as dielectric of the LC capacitor $C_{LC}$. The pixel electrode 190 is connected to the switching element Q, and the common electrode 270 is supplied with a common voltage Vcom and covers an entire surface of the upper panel 200. Unlike FIG. 2, the common electrode 270 may be provided on the lower panel 100, and both electrodes 190 and 270 may have shapes of bars or stripes.

The storage capacitor $C_{ST}$ is an auxiliary capacitor for the LC capacitor $C_{LC}$. The storage capacitor $C_{ST}$ includes the pixel electrode 190 and a separate signal line, which is provided on the lower panel 100, overlaps the pixel electrode 190 via an insulator, and is supplied with a predetermined voltage such as the common voltage Vcom. Alternatively, the storage capacitor $C_{ST}$ includes the pixel electrode 190 and an adjacent gate line called a previous gate line, which overlaps the pixel electrode 190 via an insulator.

For color display, each pixel PX uniquely represents one of primary colors (i.e., spatial division) or each pixel PX sequentially represents the primary colors in turn (i.e., temporal division) such that spatial or temporal sum of the primary colors are recognized as a desired color. An example of a set of the primary colors includes red, green, and blue colors. FIG. 2 shows an example of the spatial division that each pixel PX includes a odor filter 230 representing one of the primary colors in an area of the upper panel 200 facing the pixel electrode 190. Alternatively, the color filter 230 is provided on or under the pixel electrode 190 on the lower panel 100.

One or more polarizers (not shown) are attached to at least one of the panels 100 and 200.

Each pixel PX for the OLED may include a switching transistor (not shown) connected to the display signal lines $G_1$-$G_n$ and $D_1$-$D_m$, a driving transistor (not shown) and a storage capacitor (not shown) connected thereto, and a light emitting diode (not shown) connected to the driving transistor. The light emitting diode includes a pixel electrode (not shown), a common electrode (not shown), and a light emitting member (not shown) interposed therebetween.

Referring to FIG. 1 again, the gray signal generator 800 generates a plurality of gray signals related to the transmittance of the pixels PX. For an LCD, the gray signal generator 800 generates two sets of a plurality of gray voltages. The gray voltages in one set have a positive polarity with respect to the common voltage Vcom, while those in the other set have a negative polarity with respect to the common voltage Vcom.

The gate driver 400 is connected to the gate lines $G_1$-$G_n$ of the panel unit 300 and generates gate signals for application to the gate lines $G_1$-$G_n$ having two levels equal to a gate-on voltage Von and a gate-off voltage Voff, respectively. The gate driver 400 is integrated on the panel unit 300 and includes a plurality of driving circuits (not shown). Each of the driving circuits is connected to one of the gate lines $G_1$-$G_n$ and includes a plurality of, for example, about fourteen thin film transistors. However, the gate driver 400 may include a plurality of integrated circuit (IC) chips (not shown) mounted on the panel unit 300 or mounted on flexible printed circuit (FPC) films (not shown) that are attached to the panel unit 300.

The data driver 500 is connected to the data lines $D_1$-$D_m$ of the panel unit 300 and applies data voltages, which are selected from the gray voltages supplied from the gray signal generator 800, to the data lines $D_1$-$D_m$. The data driver 500 may be also integrated on the panel unit 300, or mounted on the panel unit 300 or on FPC films (not shown) that are attached to the panel unit 300 in forms of IC chips.

The drivers 400 and 500 or the FPC films mounting the drivers 400 and 500 are disposed on a peripheral area of the panel unit 300, which is located around the display area DA.

The signal controller 600 controls the gate driver 400 and the data driver 500 and it may be mounted on a printed circuit board (PCB).

Now, an LCD according to an embodiment of the present invention is described in detail with reference to FIGS. 3-7 as well as FIGS. 1 and 2.

Figure 3:
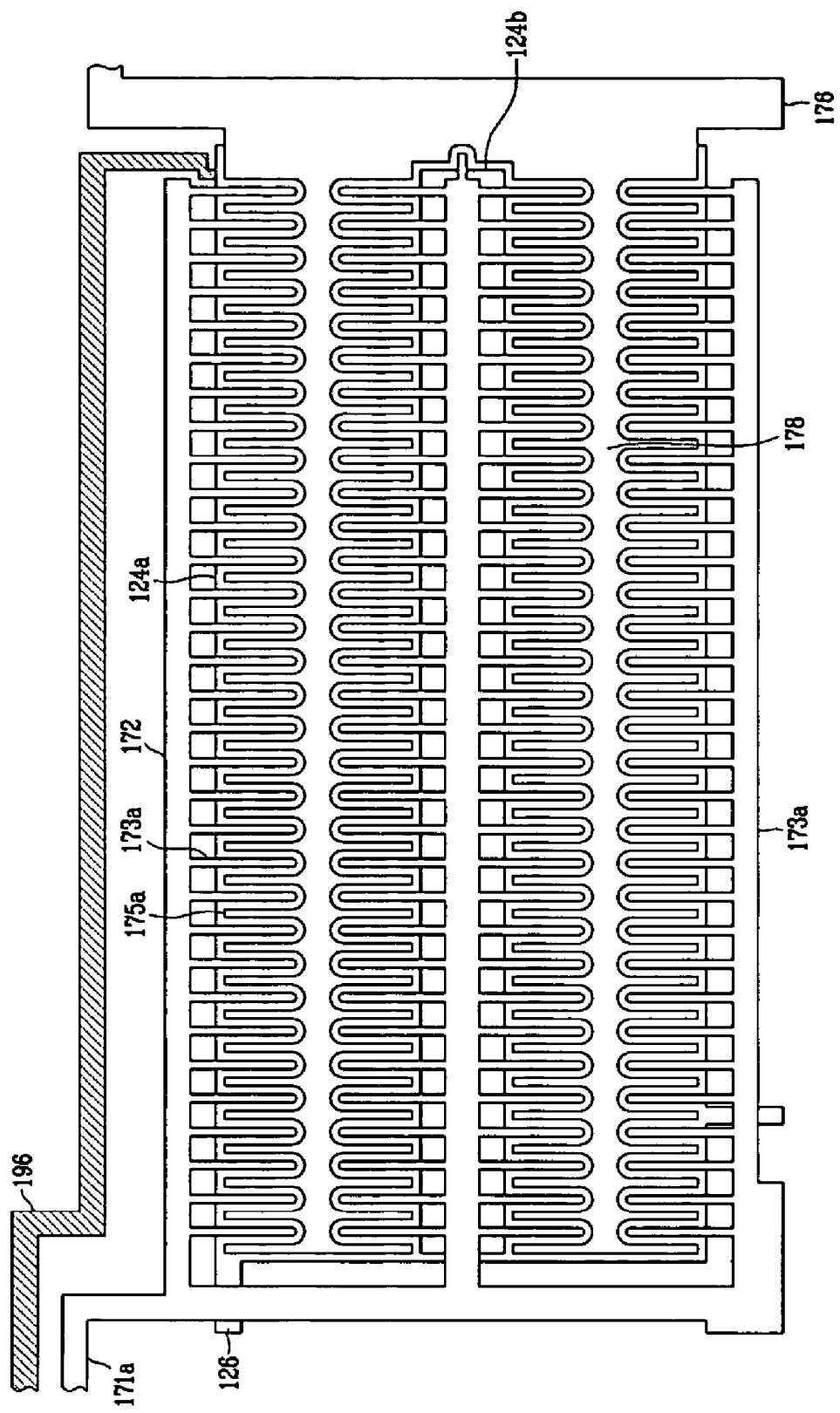
FIG. 3 is a schematic layout view of a TFT in a gate driver according to an embodiment of the present invention.
Figure 4:
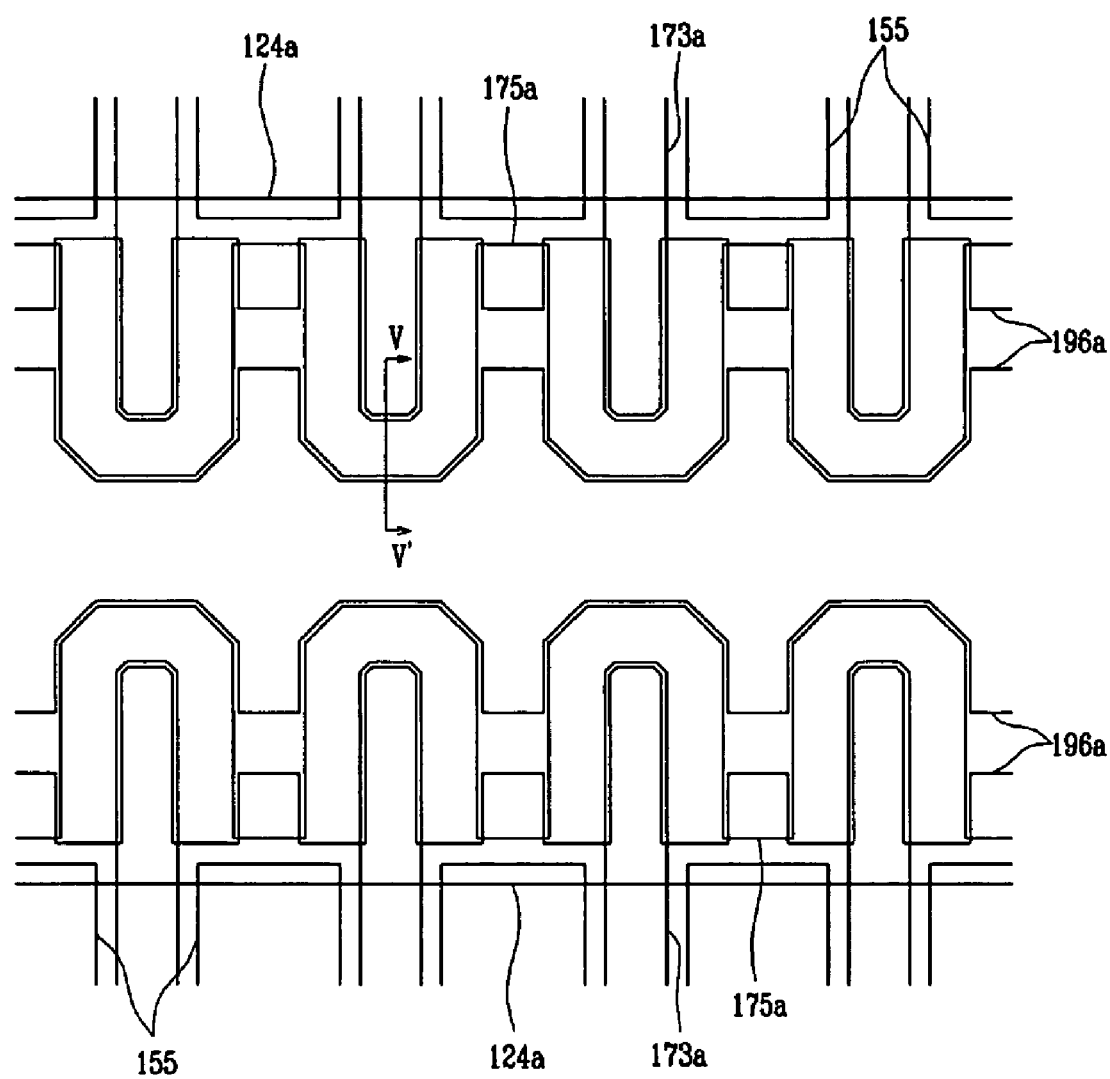
FIG. 4 is an expanded layout view of a portion of the TFT shown in FIG. 3.
Figure 5:
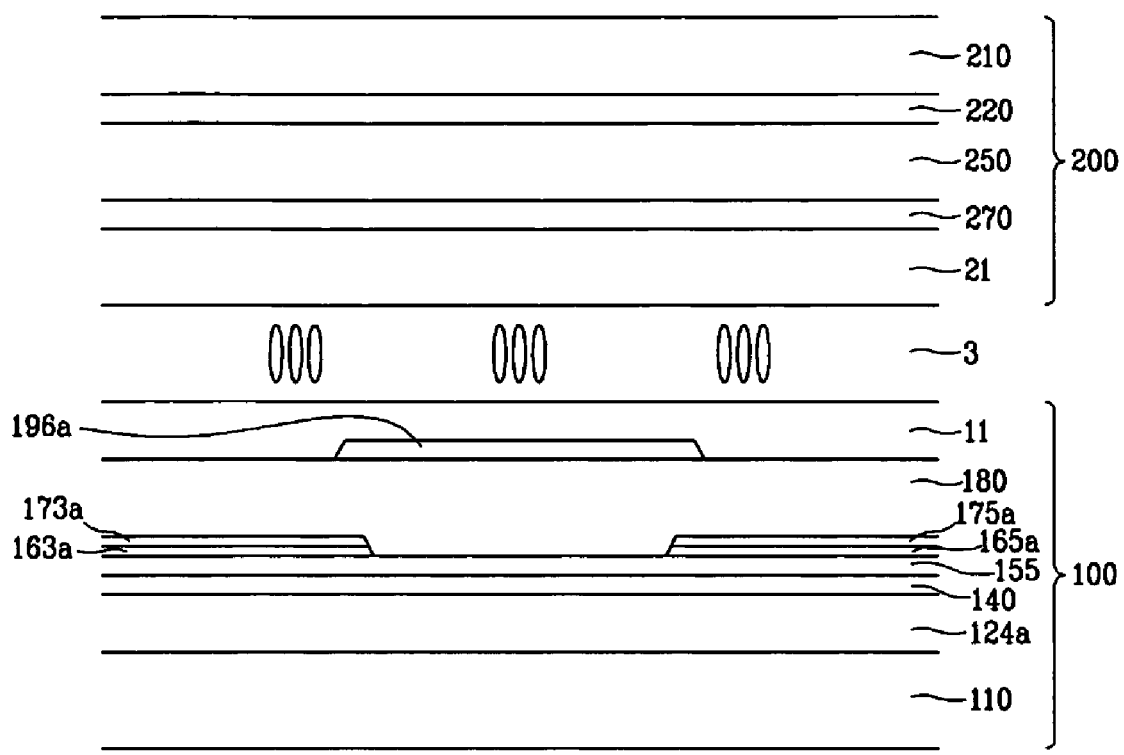
FIG. 5 is a sectional view of the TFT shown in FIG. 4 taken along the line V-V'.
Figure 6:
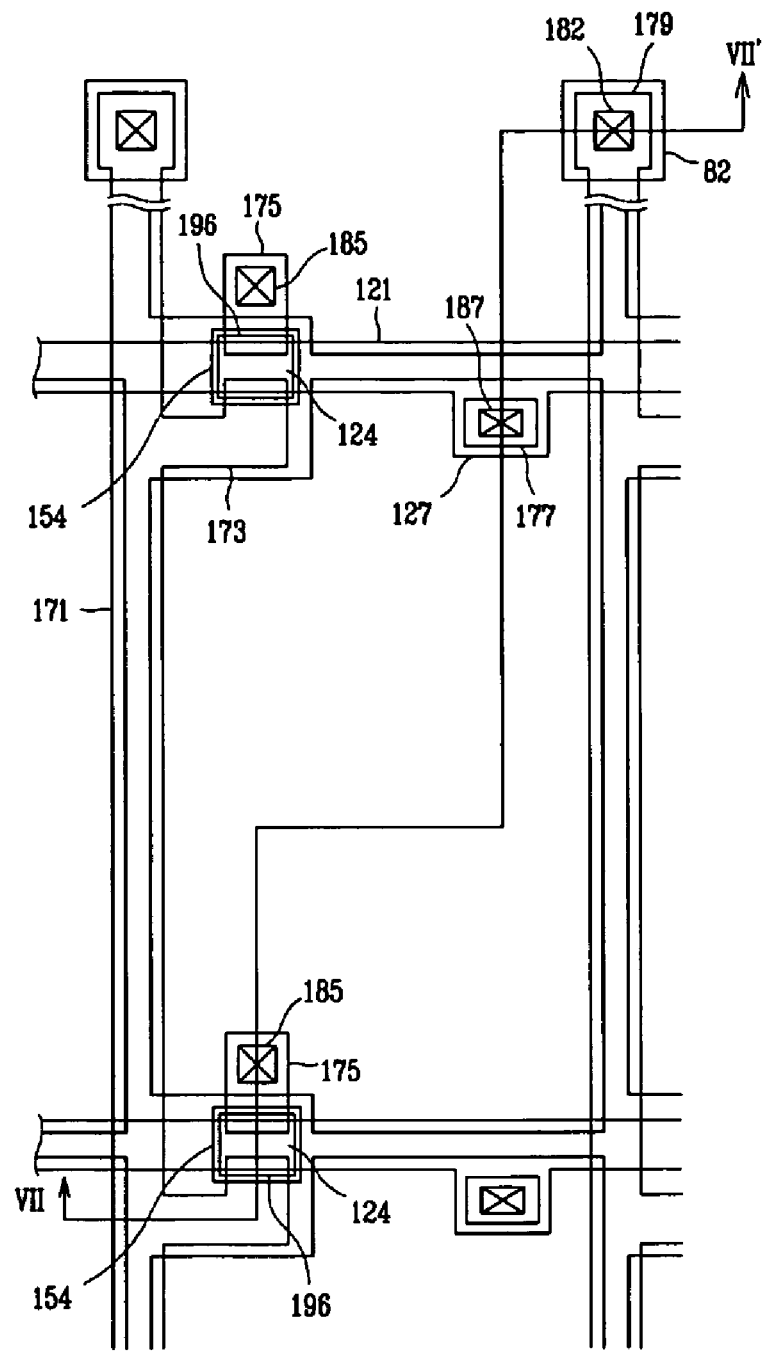
FIG. 6 is a layout view of a portion of a TFT array panel for an LCD.
Figure 7:
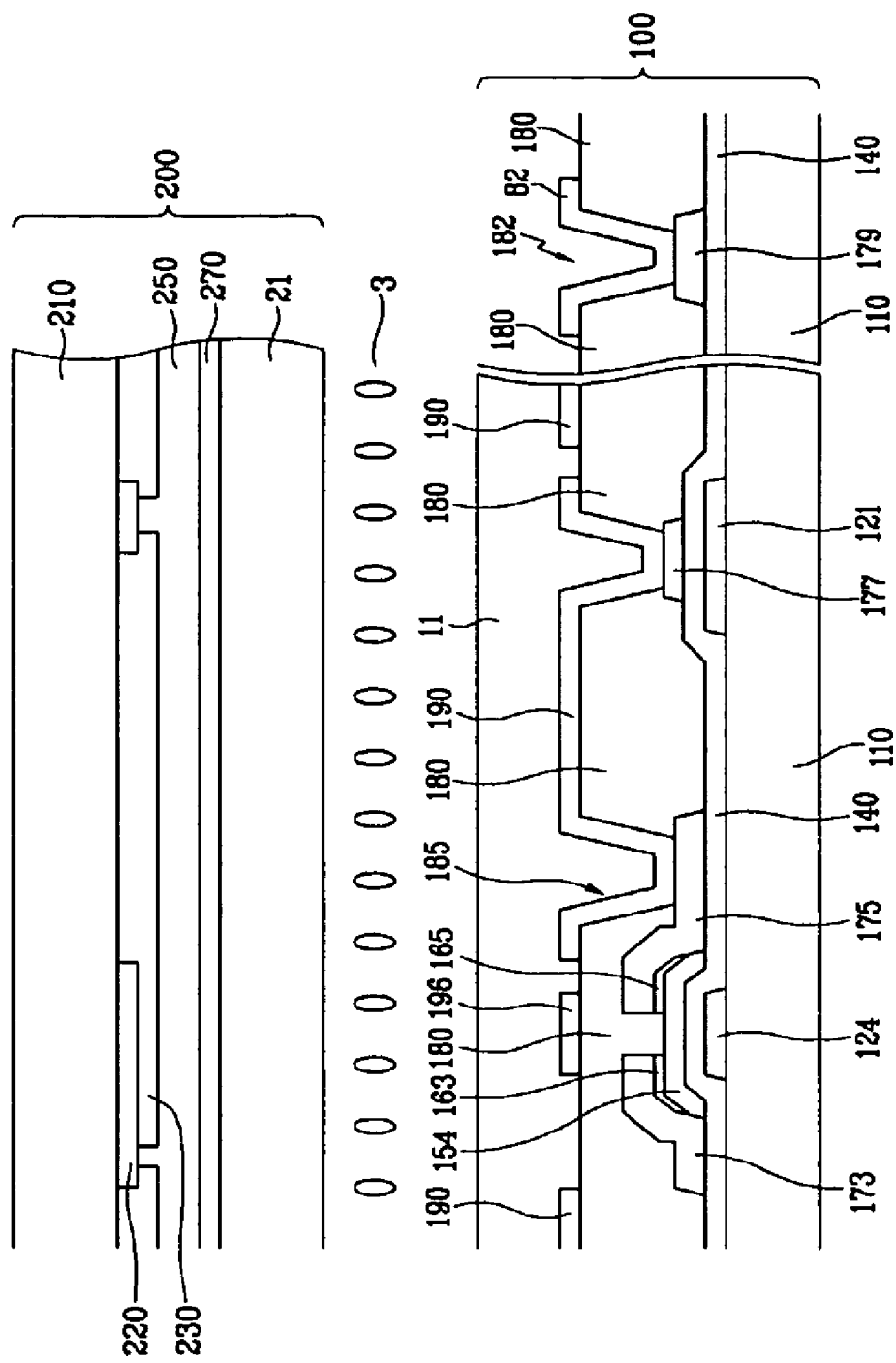
FIG. 7 is a sectional view of the TFT array panel shown in FIG. 6 taken along the line VII-VII'.

FIG. 3 is a schematic layout view of a TFT in a gate driver according to an embodiment of the present invention, FIG. 4 is an expanded layout view of a portion of the TFT shown in FIG. 3, and FIG. 5 is a sectional view of the TFT shown in FIG. 4 taken along the line V-V'. FIG. 6 is a layout view of a portion of a TFT array panel for an LCD and FIG. 7 is a sectional view of the TFT array panel shown in FIG. 6 taken along the line VII-VII'.

Referring to FIGS. 3-7, an LCD according to this embodiment includes a lower panel 100 and an upper panel 200 spaced apart from each other with a gap, and a LC layer 3 filled in the gap.

First, the upper panel 200 is described in detail.

A light blocking member 220 also referred to as a black matrix is formed on an insulating substrate 210 such as transparent glass. The light blocking member 220 has a plurality of open areas in a display area DA (shown in FIG. 1), while it has no open area in a peripheral area. A plurality of color filters 230 that may represent primary colors such as red, green and blue colors are formed on the substrate 210 and partly on the light blocking member 220 and they may be disposed only in the display area DA but not in the peripheral area. An overcoat 250, a common electrode 270, and an alignment layer 21 preferably made of polyimide are formed in sequence on the Color filters 230 and the light blocking member 220.

In an exemplary LCD, the thickness of the LC layer 3 or the length of the gap between the panels 100 and 200 is equal to about 3.7 microns, and the thickness of the color filters 230 preferably ranges from about 1.5 microns to about 1.6 microns.

Description of the lower panel 100 follows.

A plurality of gate lines 121 for transmitting gate signals and a plurality of control signal lines 126 are formed on an insulating substrate 110. Each gate line 121 extends substantially in a transverse direction and a plurality of portions of each gate line 121 form a plurality of gate electrodes 124. Each gate line 121 includes a plurality of projections 127 protruding downward.

Each control signal line 126 includes a control electrode 124a having an increased area. The control electrode 124a has an opening 124b bisecting the control electrode 124a into upper and lower halves.

The gate lines 121 and the control signal lines 126 are preferably made of Al containing metal such as Al and Al alloy, Ag containing metal such as Ag and Ag alloy, Cu containing metal such as Cu and Cu alloy, Mo containing metal such as Mo and Mo alloy, Cr, Ta, or Ti. However, the gate lines 121 and the control signal lines 126 may have a multi-layered structure including two films having different physical characteristics. One of the films is preferably made of low resistivity metal including Al containing metal, Ag containing metal, or Cu containing metal for reducing signal delay or voltage drop in the gate lines 121. On the other hand, the other of the films is preferably made of material such as Mo containing metal, Cr, Ta, Ti, and alloys thereat which has good physical, chemical, and electrical contact characteristics with other materials such as indium tin oxide (ITO) and indium zinc oxide (IZO). Examples of the films are a Cr lower film and an Al upper film and an Al lower film and a Mo upper film.

The lateral sides of the gate lines 121 are inclined relative to a surface of the substrate 110, and the inclination angle thereof ranges about 30-80 degrees.

A gate insulating layer 140 preferably made of silicon nitride (SiNx) is formed on the gate lines 121 and the control signal lines 126.

A plurality of semiconductor islands 154 and 155 preferably made of hydrogenated amorphous silicon (abbreviated to a-Si) or polysilicon are formed on the gate insulating layer 140. The semiconductor islands 154 and 155 are disposed opposite the gate electrodes 124 and the control electrodes 124a, respectively.

A plurality of pairs of ohmic contact islands 163 and 165 and other pairs of ohmic contact islands 163a and 165a preferably made of silicide or n+ hydrogenated a-Si heavily doped with n type impurity are formed on the semiconductor islands 154 and 155, respectively.

The lateral sides of the semiconductor islands 154 and 155 and the ohmic contacts 163 and 165 are inclined relative to a surface of the substrate 110, and the inclination angles thereof are preferably in a range of about 30-80 degrees.

A plurality of data lines 171, a plurality of input signal lines 171a, a plurality of drain electrodes 175, a plurality of output signal lines 176, and a plurality of storage capacitor conductors 177 are formed on the ohmic Contacts 163, 165, 163a and 165a and the gate insulating layer 140.

The data lines 171 for transmitting data voltages extend substantially in the longitudinal direction and intersect the gate lines 121. Each data line 171 includes A plurality of branches projecting toward the drain electrodes 175 to form a plurality of source electrodes 173 and an end portion 179 having a larger area for contact with another layer or an external device. Each pair of the source electrodes 173 and the drain electrodes 175 are separated from each other and opposite each other with respect to a gate electrode 124.

Each of the input signal lines 171a includes a longitudinal portion extending substantially in the longitudinal direction, a plurality of, for example, three main branches extending from the longitudinal portion substantially in the transverse direction to form input connections 172, and a plurality of secondary branches extending from the main branches 172 to a control electrode 124a in the longitudinal direction like a comb to form input electrodes 173a. A middle one of the main branches 172 overlaps an opening 124b of the Control electrode 124a.

Each of the output signal lines 176 includes an output terminal connected to one of the gate lines 121 and having a large area, a plurality of, for example, two main branches extending from the output terminal substantially in the transverse direction to form output connections 178, which are interposed between the input connections 172, and a plurality of secondary branches extending from the main branches 178 to the control electrodes 124a in the longitudinal direction like a comb to form output electrodes 175a.

The input electrodes 173a and the output electrodes 175a are alternately arranged in the transverse direction.

A gate electrode 124, a source electrode 173, and a drain electrode 175 along with a semiconductor island 154 form a switching TFT having a channel formed in the semi-conductor island 154 disposed between the source electrode 173 and the drain electrode 175. Likewise, a control electrode 124a, a set of input electrodes 173a, and a set of output electrodes 175a along with a (pair of) semiconductor island 155 form a driver TFT having a channel formed in the semiconductor island 155 disposed between the input electrode 173a and the output electrode 175a. The channel of the driver TFT has a shape of horseshoes.

The storage capacitor conductors 177 overlap the projections 127 of the gate lines 121.

The data lines 171, the input signal lines 171a, the drain electrodes 175, the output signal lines 176, and the storage capacitor conductors 177 are preferably made of refractory metal such as Mo, Cr, Ti, Ta and alloys thereof However, they may also have a multi-layered structure including a low resistivity film and a good contact film. For example, the data lines 171, etc., may include triple films including a middle film of Al or Al alloy and upper and lower films of Mo or Mo alloy.

The data lines 171, the drain electrodes 175, and the storage capacitor conductors 177 also have tapered lateral sides relative to the surface of the substrate 110, and the inclination angles thereof range about 30-80 degrees.

The ohmic contacts 163, 165, 163a and 165a are interposed only between the underlying semiconductor islands 154 and 155 and overlying layers including the data lines 171, the drain electrodes 175, and the input and the output signal lines 171a and 176 and reduce the contact resistance therebetween.

A passivation layer 180 is formed on the data lines 171, the drain electrodes 175, the input and the output signal lines 171a and 176, the storage electrode capacitors 177, and exposed portions of the semiconductor islands 154, which are not covered with the data lines 171, etc. The passivation layer 180 is preferably made of photo-sensitive organic material having a good flatness characteristic, low dielectric insulating material such as a-Si:C:O and a-Si:O:F formed by plasma-enhanced chemical vapor deposition (PECVD), or inorganic material such as silicon nitride and silicon oxide. The passivation layer 180 may have a double-layered structure including a lower inorganic film and an upper organic film.

The passivation layer 180 has a plurality of contact holes 182, 185 and 187 exposing the end portions 179 of the data lines 171, the drain electrodes 175, and the storage Inductors 177, respectively.

A plurality of pixel electrodes 190, a plurality of shielding members 196 and 196a, and a plurality of contact assistants 82, which are preferably made of transparent Inductive material such as ITO or IZO, are formed on the passivation layer 180.

The pixel electrodes 190 are physically and electrically connected to the drain elect rodes 175 through the contact holes 185 and to the storage capacitor conductors 177 through the contact holes 187 such that the pixel electrodes 190 receive the data voltages from the drain electrodes 175 and transmit the received data voltages to the storage capacitor conductors 177.

The pixel electrodes 190 supplied with the data voltages generate electric fields in cooperation with the common electrode 270 on the upper panel 200, which determine liquid crystal molecules in the liquid crystal layer 3.

As described above with reference to FIG. 2, a pixel electrode 190 and the common electrode 270 form a liquid crystal capacitor $C_{LC}$, which stores applied voltages after turn-off of the TFT. The storage capacitor $C_{ST}$ for enhancing the voltage storing capacity is implemented by overlapping the pixel electrode 190 with a previous gate line 121. The capacitances of the storage capacitors, i.e., the storage capacitances are increased by providing the projections 127 at the gate lines 121 for increasing overlapping areas and by providing the storage capacitor conductors 177, which are connected to the pixel electrodes 190 and overlap the projections 127, under the passivation layer 180 for decreasing the distance between the terminals.

The pixel electrodes 190 overlap the gate lines 121 and the data lines 171 to increase aperture ratio but it is optional.

The shielding electrodes 196 and 196a are disposed on the channel portions of the switching TFTs or the driver TFTs, respectively, which are disposed on a region between the source electrodes 173 and the drain electrodes 175 or a region between the input electrodes 173a and the output electrodes 175a. The shielding electrodes 196a have shapes of horseshoe having several curves, while the shielding electrodes 196 are rectangular. The shielding electrodes 196a may be supplied with a predetermined voltage lower than the common voltage Vcom from another signal line (not shown) and the predetermined voltage includes the gates voltage Voff and a ground voltage. However, the shielding electrodes 196a and 196 may be electrically isolated.

The contact assistants 82 are connected to the exposed end portions 179 of the data lines 171 through the contact holes 182, respectively. The contact assistants 82 protect the exposed end portions 179 and complement the adhesion between the end portions 179 and external devices.

The pixel electrodes 190 are made of transparent conductive polymer. For a reflective LCD, the pixel electrodes 190 are made of opaque reflective metal. In these cases, the contact assistants 82 may be made of material such as ITO or IZO different from the pixel electrodes 190.

An alignment layer 11 preferably made of polyimide is coated on the pixel electrodes 190, the shielding electrodes 196 and 196a, and portions of the passivation layer 180 that are not covered with the pixel electrodes 190 and the shielding electrodes 196 and 196a.

Now, the operation of the above-described LCD will be described in detail.

The signal controller 600 is supplied with input image signals R, G and B and input control signals controlling the display thereof such as a vertical synchronization signal Vsync, a horizontal synchronization signal Hsync, a main clock MCLK, and a data enable signal DE, from an external graphics controller (not shown). After generating gate control signals CONT1 and data control signals CONT2 and processing the input image signals R, G and B suitable for the operation of the panel unit 300 on the basis of the input control signals and the input image signals R, G and B, the signal controller 600 transmits the gate control signals CONT1 to the gate driver 400, and the processed image signals DAT and the data control signals CONT2 to the data driver 500.

The gate control signals CONT1 include a scanning start signal STV for instructing to start scanning and at least a clock signal for controlling the output time of the gate-on voltage Von. For example, the at least a clock signal includes a pair of clock signals having 180-degree phase difference or three or more clock signals having uniform phase differences. The gate control signals CONT1 may further include an output enable signal OE for defining the duration if the gate-on voltage Von.

The data control signals CONT2 include a horizontal synchronization start signal STH for informing of transmission if the image data DAT, a load signal LOAD for instructing to apply the data voltages to the data lines $D_l$-$D_m$, a inversion control signal RVS for reversing the polarity of the data voltages (with respect to the common voltage Vcom), and a data clock signal HCLK.

The data driver 500 receives a packet of the image data DAT for a pixel row from the signal controller 600 and converts the image data DAT into analog data signals selected from the gray signals supplied from the gray signal generator 800 in response to the data control signals CONT2 from the signal controller 600. Thereafter, the data driver 500 applies the data signals to the data lines $D_l$-$D_m$.

Responsive to the gate control signals CONT1 from the signal controller 600, the gate driver 400 applies the gate-on voltage Von to the gate line $G_l$-$G_n$, thereby turning on the switching elements Q connected thereto.

The driver TFT shown in FIGS. 3-5 is disposed at an output terminal of the gate driver 400. The output terminal of the output signal line 176 of the driver TFT is connected to one of the gate lines $G_l$-$G_n$ and applies the gate signal including the gate-on voltage to the gate line $G_l$-$G_n$. The input signal line 171a of the driver TFT is supplied with a clock signal and the controls signal 126 is supplied with a driving signal from an external device. Accordingly, the driver TFT outputs the clock signal, which is applied to the input electrode 173a through the input signal lines 171a, through the output electrode 175a and the output terminal when the driving signal applied to the control electrode 124a through the control signal line 126 has an appropriate level. A high level voltage of the clock signal is output as the gate-on voltage Von with a voltage drop by the driver TFT. A low level voltage of the clock signal may be equal to the gate-off voltage Voff that may be applied to the shielding electrodes 196a. Alternatively, the shielding electrodes 196a may be supplied with the gate-off voltage Voff supplied through a separate signal path.

Then, the data signals applied to the data lines $D_l$-$D_m$ are supplied to the pixels PX through the activated switching elements Q.

In the LCD shown in FIGS. 2-7, the difference between a voltage of a data signal, i.e., the data voltage and the common voltage Vcom is represented as a voltage across the LC capacitor $C_{LC}$, i.e., a pixel voltage. The LC molecules 310 in the LC capacitor $C_{LC}$ have orientations depending on the magnitude of the pixel voltage, and the molecular orientations determine the polarization of light passing through the LC layer 3. The polarizer(s) 11 and 21 converts the light polarization into the light transmittance.

By repeating this procedure by a unit of the horizontal period (which is indicated by 1H and equal to one period of the horizontal synchronization signal Hsync and the data enable signal DE), all gate lines $G_l$-$G_n$ are sequentially supplied with the gate-on voltage Von during a frame, thereby applying the data voltages to all pixels PX.

In the LCD shown in FIGS. 2-7, when the next frame starts after finishing one frame, the inversion control signal RVS applied to the data driver 500 is controlled such that the polarity of the data voltages is reversed (which is called frame inversion). The inversion control signal RVS may be also controlled such that the polarity of the data voltages flowing in a data line in one frame are reversed (for example, line inversion and dot inversion), or the polarity of the data voltages in one packet are reversed (for example, column inversion and dot inversion).

At this time, the shielding electrodes 196 and 196a block the effect of the common voltage Vcom applied to the common electrode 270 on the channels of the TFTs having the electrodes 124, 173, 175, 124a, 173a and 175a and the semiconductors 154 and 155 to prevent the deterioration of the threshold voltage of the TFTs. In addition, the application of the predetermined voltage such as the gate-off voltage Voff lower than the common voltage Vcom to the shielding electrodes 196 and 196a reduces a driving voltage of the TFTs and advances the switching time of the TFTs, thereby increasing the efficiency of input voltages supplied to the TFTs and the efficiency of the operation of the TFTs.

Furthermore, the employment of the shielding electrode 196 and 196a do not increase the manufacturing cost or do not complicate the manufacturing process since the shielding electrodes 196 and 196a are formed along with the pixel electrodes 190.

The advantages of the shielding electrodes are described in detail in an indirect way that the common voltage applied to the common electrode is varied or the common electrode is removed with reference to FIGS. 8-14.

Figure 8:
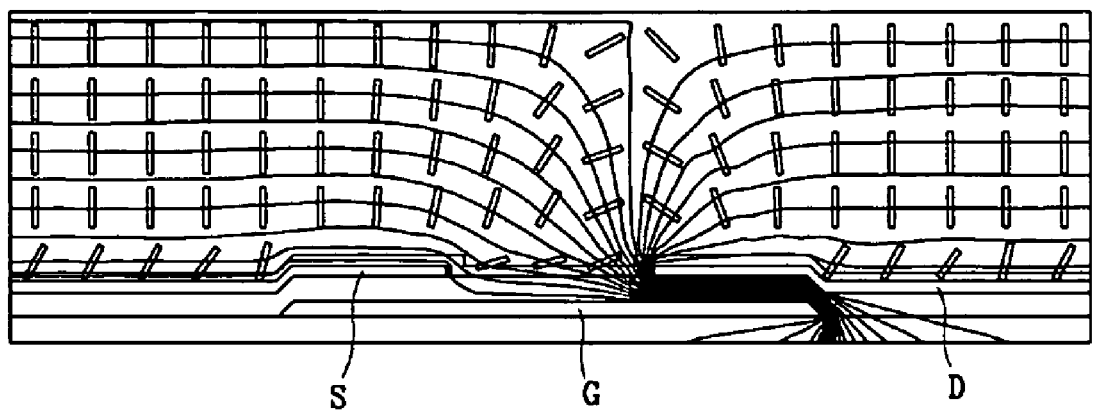
FIGS. 8 and 9 show orientations of LC molecules and equipotential lines in a LC layer under the application of a common voltages of +3.3V and −1.0V to a common electrode, respectively.
Figure 9:
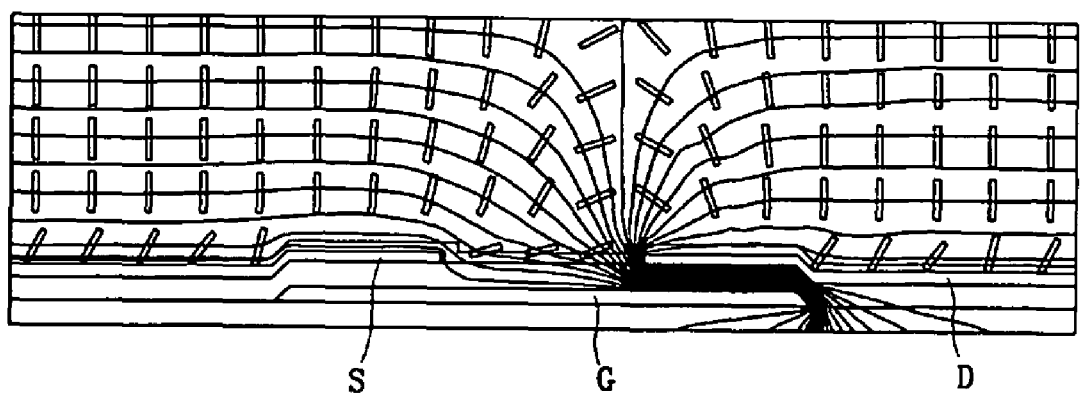
Figure 10:
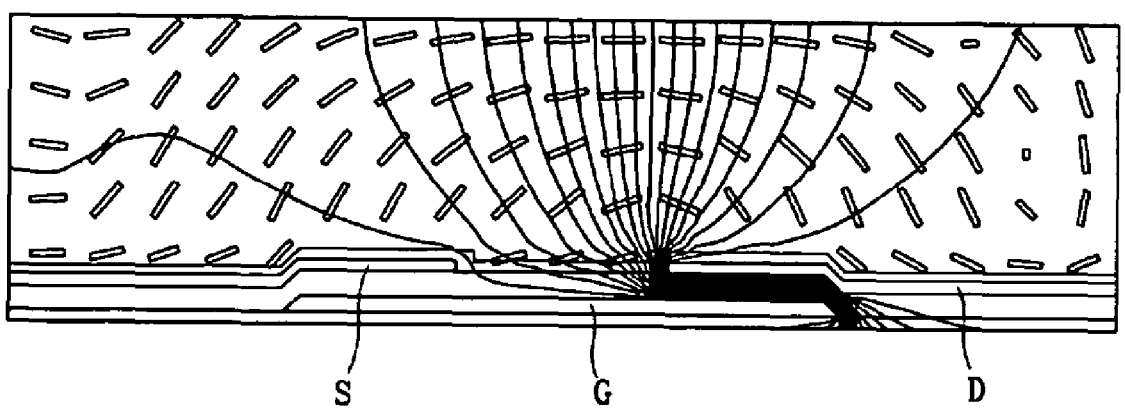
FIG. 10 show orientations of LC molecules and equipotential lines in the LC layer without a common electrode.

Referring to FIGS. 8-10, the variations of orientations of LC molecules and equipotential lines in a LC layer depending on the magnitude of a common voltage applied to a common electrode in LCDs are described in detail.

FIGS. 8 and 9 show orientations of LC molecules and equipotential lines in a LC layer under the application of a common voltages of +3.3V and −1.0V to a common electrode, respectively, and FIG. 10 show orientations of LC molecules and equipotential lines in the LC layer without a common electrode. The voltages of a gate electrode (or a control electrode) G, a source electrode (or an input electrode) S, and a drain electrode (or an output electrode) D of a TFT were 25V, 25V, and 14V, respectively. The LC layer has positive anisotropy.

As shown in FIGS. 8 and 9, a higher common voltage makes greater effects on the voltages of the source electrode S and the drain electrode D such that the equipotential lines become more horizontal. However, the equipotential lines, which determine the orientations of the LC molecules, are determined only by the voltages of the drain electrode D and the source electrode S when there is no common electrode as shown in FIG. 10.

Accordingly, it is apparent that the operational efficiency of the TFT becomes better as the magnitude of the common voltage becomes smaller since a decreased magnitude of the common voltage reduces the threshold voltage of the TFT as described above.

Referring to FIGS. 11-14, the variation of gate signals outputted from a gate driver of an LCD depending on the common voltage.

Figure 11:
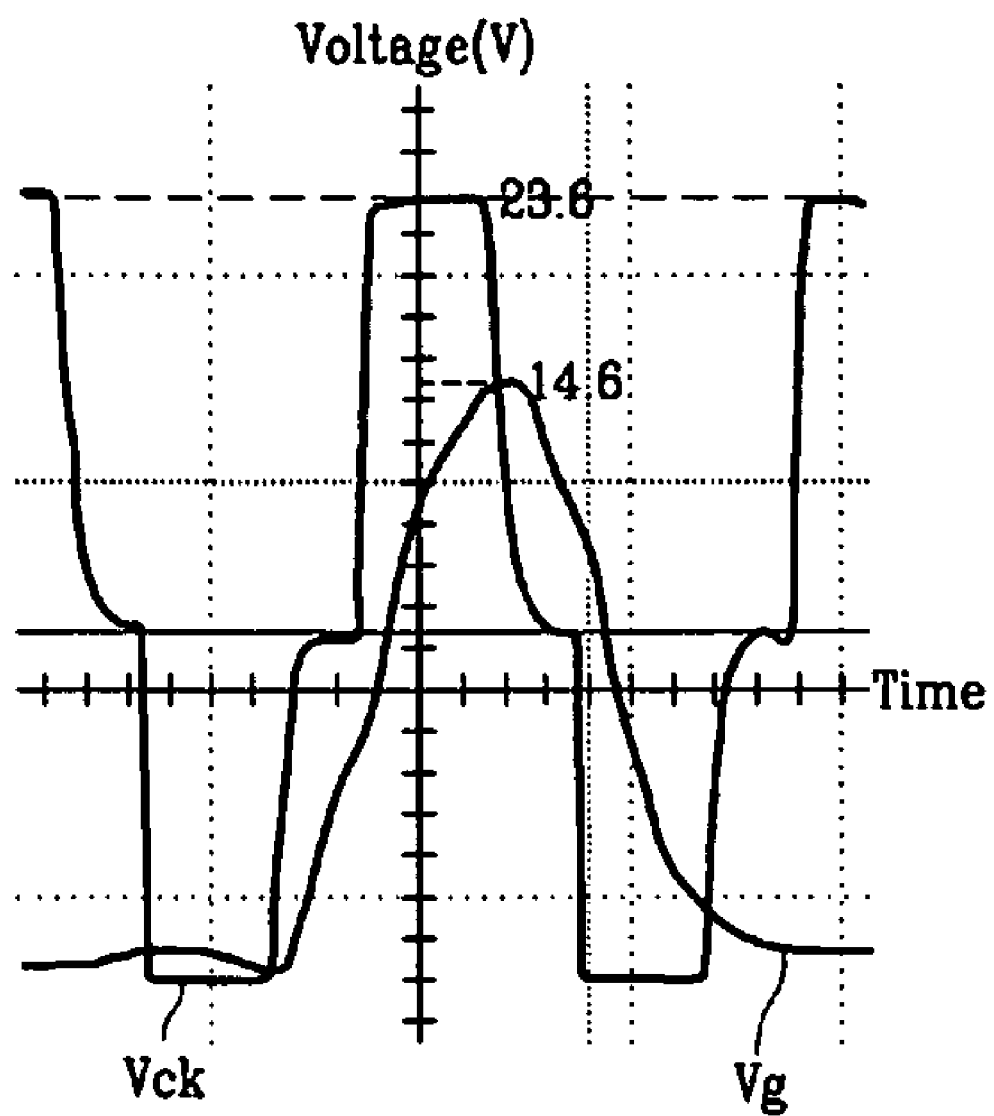
FIGS. 11 and 12 illustrate waveforms of a gate signal under the application of a common voltage equal to +3.3V with and without a LC layer, respectively.
Figure 12:
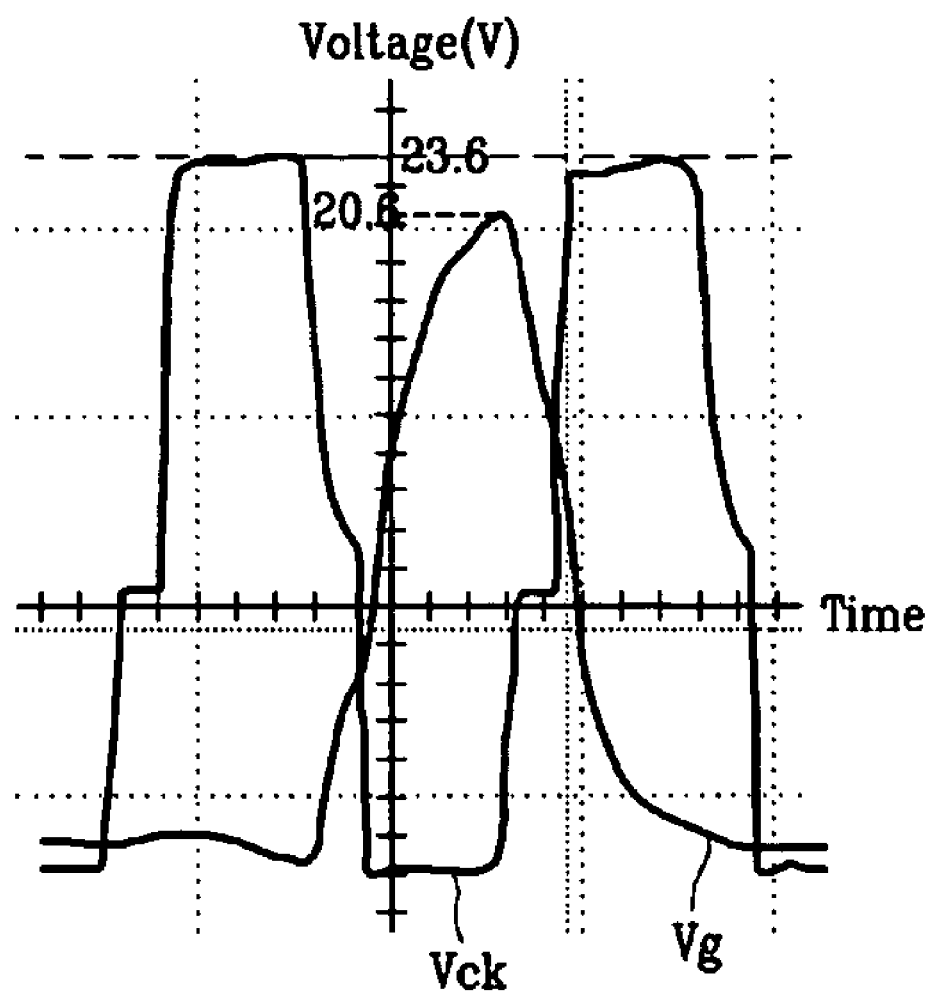
Figure 13:
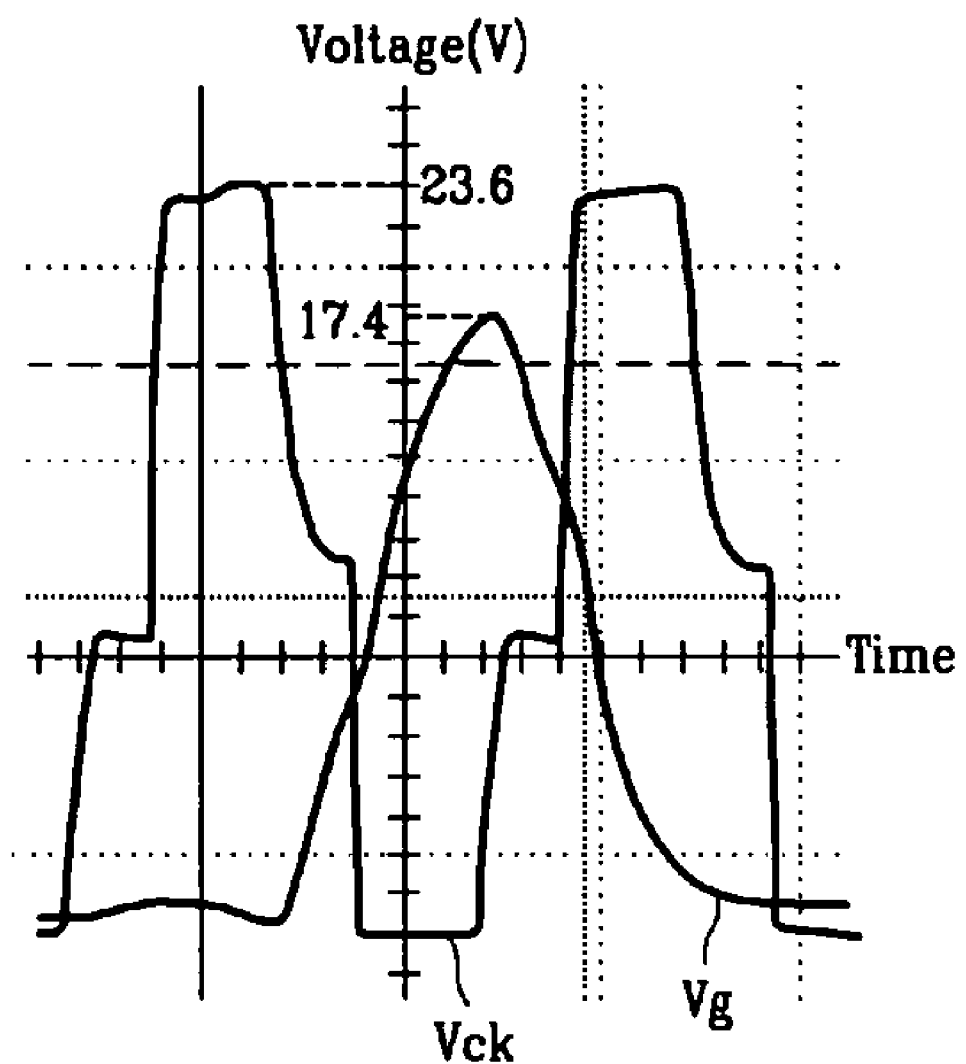
FIGS. 13 and 14 illustrate waveforms of a gate signal under the application of a common voltage equal to −1.0V with and without a LC layer, respectively.
Figure 14:
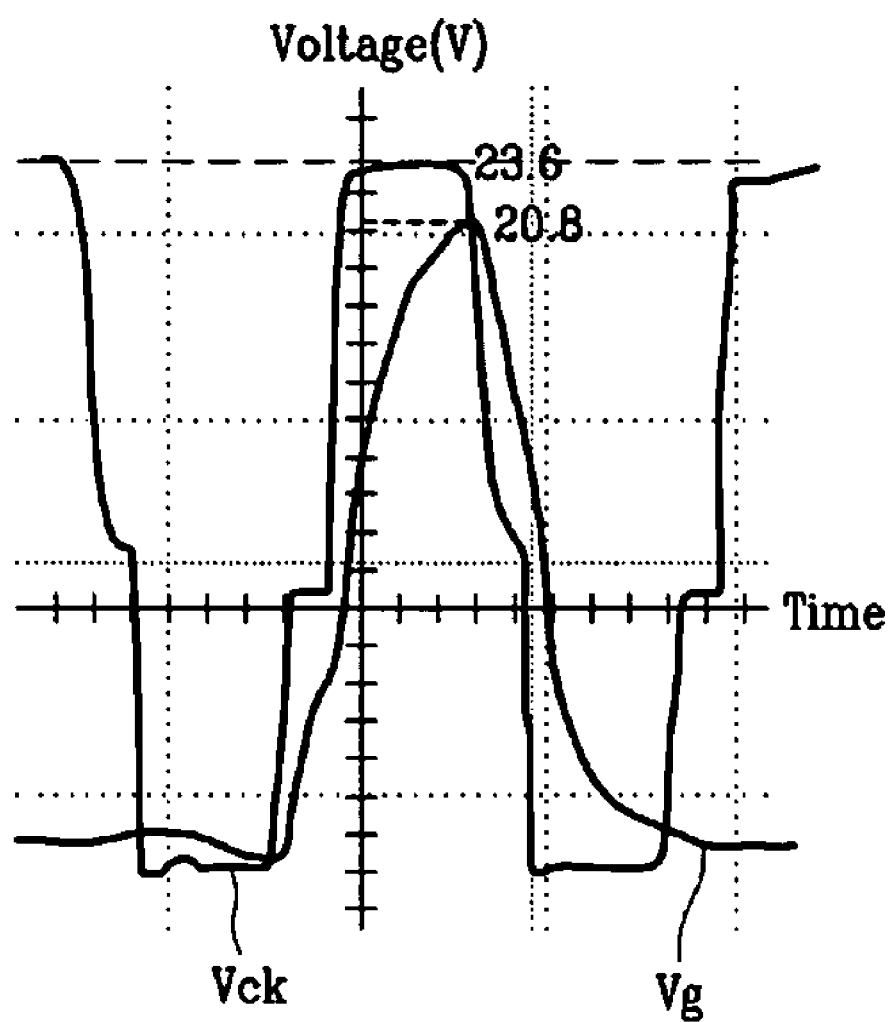

FIGS. 11 and 12 illustrate waveforms of a gate signal under the application of a common voltage equal to +3.3V with and without a LC layer, respectively, and FIGS. 13 and 14 illustrate waveforms of a gate signal under the application of a common voltage equal to −1.0V with and without a LC layer, respectively. In FIGS. 11-14, reference characters Vg and $V_{CK}$ denote the gate signal and a clock signal used for generating the gate signal and having a high level voltage equal to +23.6V.

In presence of the LC layer, the high level voltage (i.e., the gate-on voltage Von) of the gate signal Vg under the common voltage of +3.3V as shown in FIG. 11 is equal to about +14.6V, which is lower than the high level voltage of the clock signal $V_{CK}$ by about 9.0V. On the contrary, the gate-on voltage Von of the gate signal Vg under the common voltage of −1.0V as shown in FIG. 13 is equal to about +20.6V, which is lower than the high level voltage of the clock signal $V_{CK}$ by only about 3.0V. Accordingly, it is understood that the operational efficiency of the TFT is improved as the common voltage becomes lower since a lower common voltage makes less effects on the LC layer and the electrodes to reduce the voltage drop of the gate signal from the gate driver.

In the absence of the LC layer, the gate-on voltages Von of the gate signal Vg under the common voltage of +3.3V and −1.0V shown in FIGS. 12 and 14 are equal to about +20.6V and +20.8V, respectively, which are almost equal to each other. This means that the common voltage does not significantly affect the operation of the TFT.

The above-described results indicate that the shielding electrodes supplied with a voltage lower than the common voltage improves the operational efficiency of the TFTs, particularly when a dielectric material such as a LC layer is disposed between the common electrode and the TFT.

The above descriptions may be adapted to other flat panel display devices such as OLED.

Although preferred embodiments of the present invention have been described in detail hereinabove, it should be clearly understood that many variations and/or modifications of the basic inventive concepts herein taught which may appear to those skilled in the present art will still fill within the spirit and scope of the present invention, as defined in the appended claims.

The invention claimed is:

1. A thin film transistor comprising:
   a gate electrode;
   a gate insulating layer formed on the gate electrode;
   a semiconductor layer formed on the gate insulating layer and disposed opposite the gate electrode;
   a source electrode and a drain electrode that are formed at least in part on the semiconductor layer and face each other, the source electrode and the drain electrode each having branches, the branches of the source electrode extending toward the drain electrode, the branches of the drain electrode extending toward the source electrode, and the branches of the source electrode arranged in alternating manner with the branches of the drain electrode;
   a passivation layer formed on the source electrode, the drain electrode, and a portion of the semiconductor layer that is not covered with the source electrode and the drain electrode; and
   a shielding electrode formed on the passivation layer and disposed on a region between the source electrode and the drain electrode, the shielding electrode being electrically connected to a signal line configured to transmit at least one of a gate-off voltage and a ground voltage,
   wherein the shielding electrode overlaps the gate electrode,
   wherein the shielding electrode provides a common voltage shielding for the region on which it is disposed,
   wherein the shielding electrode comprises a transparent electrode, and
   wherein edges of the shielding electrode substantially overlap edges of the region between the source electrode and the drain electrode in plan view.

2. The thin film transistor of claim 1, wherein the shielding electrode is electrically isolated.

3. The thin film transistor of claim 1, wherein the shielding electrode is supplied with a predetermined voltage.

4. The thin film transistor of claim 3, wherein the predetermined voltage supplied to the shielding electrode is equal to or lower than a ground voltage.

5. The thin film transistor of claim 3, wherein the predetermined voltage supplied to the shielding electrode is a negative voltage.

6. The thin film transistor of claim 1, wherein the shielding electrode comprises IZO or ITO.

7. The thin film transistor of claim 1, wherein the shielding electrode has a shape of horseshoes.

8. The thin film transistor of claim 1, wherein the passivation layer comprises organic insulator.

9. A thin film transistor array panel comprising:
a gate line and a data line;
a first thin film transistor including a control electrode, an input electrode, an output electrode, and a channel portion disposed between the input electrode and the output electrode and generating a gate signal to be applied to the gate line;
a second thin film transistor including a gate electrode connected to the gate line, a source electrode connected to the data line, a drain electrode, and a channel portion disposed between the source electrode and the drain electrode and transmitting a data signal from the data line in response to the gate signal from the gate line;
a pixel electrode connected to the drain electrode to receive the data signal;
a common electrode facing the pixel electrode; and
a first shielding electrode disposed on the channel portion of the first thin film transistor, the shielding electrode being electrically connected to a signal line configured to transmit at least one of a gate-off voltage and a ground voltage,
wherein the first shielding electrode is formed of the same layer as the pixel electrode,
wherein the first shielding electrode overlaps the control electrode,
wherein when a common voltage is applied to a common electrode, the at least one of a gate-off voltage and a ground voltage is applied to the first shielding electrode, so that the shielding electrode provides a common voltage shielding for the area on which it is disposed, and
wherein edges of the shielding electrode substantially overlap edges of a region between the source electrode and the drain electrode in plan view.

10. The thin film transistor array panel of claim 9, wherein the first shielding electrode is electrically isolated.

11. The thin film transistor array panel of claim 9, wherein the first shielding electrode is supplied with a predetermined voltage.

12. The thin film transistor array panel of claim 11, wherein the predetermined voltage supplied to the first shielding electrode is equal to or lower than a ground voltage.

13. The thin film transistor array panel of claim 11, wherein the predetermined voltage supplied to the first shielding electrode is a negative voltage.

14. The thin film transistor array panel of claim 11, wherein the predetermined voltage supplied to the first shielding electrode has a magnitude for turning off the second thin film transistor.

15. The thin film transistor array panel of claim 9, further comprising a second shielding electrode disposed on the channel portions of the second thin film transistor and including the same layer as the pixel electrode.

16. The thin film transistor array panel of claim 15, further comprising an insulating layer disposed between the first and the second thin film transistors and the first and the second shielding electrodes.

17. The thin film transistor array panel of claim 16, wherein the insulating layer comprises organic material.

18. A display device comprising:
a gate line and a data line;
a first thin film transistor including a gate electrode, a source electrode, a drain electrode, and a channel portion disposed between the source electrode and the drain electrode and generating a gate signal to be applied to the gate line;
a second thin film transistor transmitting a data signal from the data line in response to the gate signal from the gate line;
a pixel electrode connected to the second thin film transistor to receive the data signal;
a shielding electrode disposed on the channel portion between the source electrode and the drain electrode of the first thin film transistor, the shielding electrode being electrically connected to a signal line configured to transmit at least one of a gate-off voltage and a ground voltage, wherein the shielding electrode is formed of the same layer as the pixel electrode, and wherein the shielding electrode overlaps the gate electrode; and
a common electrode facing the pixel electrode,
wherein when a common voltage is applied to the common electrode, the at least one of a gate-off voltage and a ground voltage is applied to the shielding electrode, so that the shielding electrode provides a common voltage shielding for the area on which it is disposed, and
wherein edges of the shielding electrode substantially overlap edges of a region between the source electrode and the drain electrode in plan view.

19. The display device of claim 18, wherein the shielding electrode faces the common electrode.

20. The display device of claim 19, wherein the shielding electrode is supplied with a predetermined voltage lower than a voltage applied to the common electrode.

21. The display device of claim 20, wherein the predetermined voltage supplied to the shielding electrode has a magnitude for turning off the second thin film transistor.

22. The display device of claim 18 further comprising a dielectric layer disposed between the shielding electrode and the common electrode.

23. The display device of claim 22, wherein the dielectric layer comprises a liquid crystal layer.

24. The thin film transistor of claim 1, wherein the shielding electrode is formed on a channel portion of the thin film transistor.

25. A thin film transistor array panel comprising:
a gate line and a data line;
a first thin film transistor including a control electrode, an input electrode, an output electrode, and a channel portion disposed between the input electrode and the output electrode and generating a gate signal to be applied to the gate line;
a second thin film transistor including a gate electrode connected to the gate line, a source electrode connected to the data line, a drain electrode, and a channel portion disposed between the source electrode and the drain electrode and transmitting a data signal from the data line in response to the gate signal from the gate line;
a pixel electrode connected to the drain electrode to receive the data signal;
a common electrode facing the pixel electrode; and a first shielding electrode disposed on the channel portion between the source electrode and the drain electrode of the second thin film transistor, the shielding electrode being electrically connected to a signal line configured to transmit at least one of a gate-off voltage and a ground voltage, wherein the second thin film transistor is formed of the same layer as the pixel electrode, and wherein the shielding electrode overlaps the gate electrode, wherein when a common voltage is applied to the common electrode, the at least one of a gate-off voltage and a ground voltage is applied to the first shielding electrode, so that the first shielding electrode provides a common voltage shielding for the area on which it is disposed.

26. The thin film transistor array panel of claim 25, further comprising a second shielding electrode disposed on the channel portion between the source electrode and the drain electrode of the first thin film transistor, wherein the second shielding electrode of the first thin film transistor is formed of the same layer as the pixel electrode.

27. The thin film transistor array panel of claim 25, wherein the first shielding electrode is electrically isolated.

28. The thin film transistor array panel of claim 25, wherein the first shielding electrode comprises a transparent electrode.

29. The thin film transistor array panel of claim 25, wherein the first shielding electrode is supplied with a predetermined voltage.

30. The thin film transistor array panel of claim 25, wherein the second thin film transistor is formed of the same layer as the pixel electrode.

31. The thin film transistor array panel of claim 25, wherein the shielding electrode overlaps the gate electrode.

32. The thin film transistor array panel of claim 25, wherein edges of the shielding electrode substantially overlap edges of a region between the source electrode and the drain electrode in plan view.

* * * * *